(12) United States Patent
Yamada

(10) Patent No.: US 10,758,998 B2
(45) Date of Patent: Sep. 1, 2020

(54) DIVIDING METHOD OF WORKPIECE AND LASER PROCESSING APPARATUS

(71) Applicant: DISCO CORPORATION, Tokyo (JP)

(72) Inventor: Hiroaki Yamada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 284 days.

(21) Appl. No.: 15/835,096

(22) Filed: Dec. 7, 2017

(65) Prior Publication Data
US 2018/0161919 A1    Jun. 14, 2018

(30) Foreign Application Priority Data

Dec. 8, 2016 (JP) .................................. 2016-238301

(51) Int. Cl.
*B23K 26/02* (2014.01)
*B23K 26/08* (2014.01)
(Continued)

(52) U.S. Cl.
CPC .............. *B23K 26/02* (2013.01); *B23K 26/08* (2013.01); *B23K 26/0876* (2013.01); *B23K 26/359* (2015.10); *B23K 26/364* (2015.10); *B23K 26/40* (2013.01); *B23K 26/60* (2015.10); *B23K 26/70* (2015.10); *H01L 21/67092* (2013.01); *H01L 21/67144* (2013.01); *H01L 21/78* (2013.01);
(Continued)

(58) Field of Classification Search
CPC ....................................................... B23K 26/02
USPC ............................ 219/121.82, 121.11–121.86
See application file for complete search history.

(56) References Cited

U.S. PATENT DOCUMENTS 6,271,102 B1 * 8/2001 Brouillette ........... B23D 59/002
                                                    257/E21.518
6,465,330 B1    10/2002 Takahashi et al.
(Continued)

FOREIGN PATENT DOCUMENTS

JP      10-305420       11/1998
JP      2002192370 A    7/2002
(Continued)

OTHER PUBLICATIONS

Clark et al., "Chapter 5, Wafer Finishing—Dicing, Picking, Shipping", in Area Array Interconnection Handbook, Puttlitz et al. (eds.), Springer Science Business Media, New York (2001). (Year: 2001). (Continued)

*Primary Examiner* — Lori L Baker
(74) *Attorney, Agent, or Firm* — Greer Burns & Crain, Ltd.

(57) ABSTRACT

A dividing method of a workpiece includes a dicing tape sticking step of sticking a dicing tape to the workpiece. A first laser processing step includes irradiating the workpiece with a laser beam with such a wavelength as to be absorbed by the workpiece along a first direction to form first laser-processed grooves. A first expanding step includes expanding the dicing tape in a second direction to enlarge the width of the first laser-processed grooves. A second laser processing step includes irradiating the workpiece with the laser beam with such a wavelength as to be absorbed by the workpiece along the second direction to form second laser-processed grooves, and a second expanding step includes expanding the dicing tape in the first direction to enlarge the width of the second laser-processed grooves.

7 Claims, 9 Drawing Sheets

(51) Int. Cl.
    *B23K 26/364*     (2014.01)
    *B23K 26/40*     (2014.01)
    *H01L 21/78*     (2006.01)
    *H01L 21/67*     (2006.01)
    *B23K 26/359*     (2014.01)
    *B23K 26/60*     (2014.01)
    *B23K 26/70*     (2014.01)
    *H01L 33/00*     (2010.01)
    *B23K 103/00*     (2006.01)

(52) U.S. Cl.
    CPC ...... *B23K 2103/50* (2018.08); *H01L 33/0095* (2013.01)

(56) References Cited

U.S. PATENT DOCUMENTS

| | | | | |
|---|---|---|---|---|
| 6,827,636 B2* | 12/2004 | Yamada | ............. | H01L 21/6835 451/65 |
| 6,998,571 B2* | 2/2006 | Sekiya | ............. | B23K 26/0853 219/121.67 |
| 7,087,857 B2* | 8/2006 | Nakamura | ............. | B28D 5/022 219/121.72 |
| 7,179,723 B2* | 2/2007 | Genda | ............. | B23K 26/18 257/E21.599 |
| 7,183,007 B2* | 2/2007 | Yamamoto | ............. | H01L 21/6836 428/500 |
| 7,446,022 B2* | 11/2008 | Yoshikawa | ............. | B23K 26/40 438/463 |
| 8,124,909 B2* | 2/2012 | Sawabe | ............. | B23K 26/046 219/121.67 |
| 8,168,030 B2* | 5/2012 | Matsuo | ............. | B23K 26/38 156/272.8 |
| 8,263,900 B2* | 9/2012 | Maehara | ............. | B23K 26/146 219/121.67 |
| 8,288,679 B2* | 10/2012 | Unrath | ............. | B23K 26/082 219/121.67 |
| 8,314,014 B2* | 11/2012 | Morikazu | ............. | B23K 26/0608 438/463 |
| 8,378,257 B2* | 2/2013 | Nomaru | ............. | B23K 26/032 219/121.67 |
| 8,431,428 B2* | 4/2013 | Sekiya | ............. | B28D 5/0011 438/68 |
| 8,624,156 B2* | 1/2014 | Matsuo | ............. | B23K 26/38 219/121.71 |
| 8,704,125 B2* | 4/2014 | Kettner-Reich | ............. | B23K 26/10 219/121.6 |
| 8,779,325 B2* | 7/2014 | Nomaru | ............. | B23K 26/032 219/121.61 |
| 8,847,113 B2* | 9/2014 | Unrath | ............. | B23K 26/0732 219/121.73 |
| 9,095,931 B2* | 8/2015 | Morikazu | ............. | B23K 26/0626 |
| 9,117,895 B2* | 8/2015 | Morikazu | ............. | H01L 21/78 |
| 9,172,202 B2* | 10/2015 | Imai | ............. | B23K 26/0613 |
| 9,421,638 B2* | 8/2016 | Nakagawa | ............. | B23K 26/0853 |
| 9,649,775 B2* | 5/2017 | Kumazawa | ............. | B23K 26/0093 |
| 9,656,347 B2* | 5/2017 | Morikazu | ............. | B23K 26/40 |
| 9,724,783 B2* | 8/2017 | Odagiri | ............. | B23K 26/0622 |
| 9,796,049 B2* | 10/2017 | Nomaru | ............. | B23K 26/364 |
| 9,849,545 B2* | 12/2017 | Popp | ............. | B23K 10/00 |
| 9,862,055 B2* | 1/2018 | Goya | ............. | B23K 26/38 |
| 9,870,961 B2* | 1/2018 | Iwamoto | ............. | H01L 22/32 |
| 9,895,768 B2* | 2/2018 | Kuki | ............. | B23K 26/032 |
| 2005/0196941 A1 | 9/2005 | Park et al. | | |
| 2005/0205531 A1* | 9/2005 | Iizuka | ............. | B23K 26/0648 219/121.18 |
| 2006/0084239 A1 | 4/2006 | Nagai et al. | | |
| 2006/0157191 A1* | 7/2006 | Matsuo | ............. | B23K 26/38 156/272.8 |
| 2007/0105345 A1* | 5/2007 | Kurosawa | ............. | H01L 21/78 438/460 |
| 2008/0108262 A1* | 5/2008 | Asai | ............. | B26F 3/004 442/1 |
| 2010/0087023 A1* | 4/2010 | Endo | ............. | B23K 26/0626 438/33 |
| 2014/0315372 A1 | 10/2014 | Nakamura | | |
| 2016/0007479 A1 | 1/2016 | Hattori et al. | | |
| 2016/0326403 A1 | 11/2016 | Yoneyama et al. | | |

FOREIGN PATENT DOCUMENTS

| | | |
|---|---|---|
| JP | 2002-334852 | 11/2002 |
| JP | 2005116739 A | 4/2005 |
| JP | 2007-007668 | 1/2007 |
| JP | 2007027562 A | 2/2007 |
| JP | 2015082642 A | 4/2015 |

OTHER PUBLICATIONS

Moore, "Sticky Issues with Semiconductor Processing Tape", Semiconductor Equipment Corp., Mar. 26, 2014, https://www.semicorp.com/articles/published-articles/item/sticky-issues-with-semiconductor-processing-tape (Year: 2014).

Agari, Masamitsu, U.S. Appl. No. 15/977,656, filed May 11, 2018.

* cited by examiner

DIVIDING METHOD OF WORKPIECE AND LASER PROCESSING APPARATUS

BACKGROUND OF THE INVENTION

Field of the Invention

The present invention relates to a dividing method for dividing a plate-shaped workpiece (herein after simply called workpiece) and laser processing apparatus.

Description of the Related Art

There is a method in which, in order to divide a workpiece, for example, laser processing (ablation processing) in which processed grooves are formed in the workpiece by irradiating the workpiece with a laser beam with such a wavelength as to be absorbed by the workpiece is carried out and thereafter an external force is applied along the processed grooves to divide the workpiece into cut pieces having a predetermined shape (for example, refer to Japanese Patent Laid-Open No. Hei 10-305420). Furthermore, there is a method in which, in order to divide a wafer on which devices are formed in the respective regions marked out by planned dividing lines in a lattice manner on a surface into individual chips, for example, processed grooves with a predetermined depth along the planned dividing lines are formed by a laser beam or a cutting blade and thereafter an external force is applied along the planned dividing lines to divide the wafer with the processed grooves being the point of origin (for example, refer to Japanese Patent Laid-Open No. 2007-7668). As apparatus that applies the external force to the wafer, expanding apparatus that can expand the wafer supported by an annular frame with the intermediary of an adhesive tape in the surface direction is used (for example, refer to Japanese Patent Laid-Open No. 2002-334852).

SUMMARY OF THE INVENTION

However, when processed grooves are formed in a workpiece by the above-described laser processing, a problem occurs that debris generated through melting of the workpiece due to irradiation with a laser beam enters the processed grooves and chips obtained by dividing join due to the debris and cannot be divided. Normally, in the case of forming grooves that completely cut a workpiece by laser processing, the workpiece is completely divided by repeatedly carrying out irradiation of the same planned dividing line with a laser beam. Here, accumulation of the debris can be prevented if the processing condition is set to a condition in which the output power of one time of irradiation with the laser beam is set lower and the time interval of the irradiation with the laser beam is set longer. However, for example, if laser processing is carried out under the above-described processing condition also for a workpiece like a warped metal, the position of the planned dividing line deviates. Therefore, there is a problem that it is impossible to accurately irradiate the same position with the laser beam and the workpiece cannot be completely divided.

Thus, an object of the present invention is to provide a dividing method of a workpiece and laser processing apparatus that prevent joining of cut pieces or chips due to debris and allow the workpiece to be completely divided.

In accordance with an aspect of the present invention, there is provided a dividing method of a workpiece in which the workpiece is divided into predetermined dimensions marked out based on a first direction and a second direction orthogonal to the first direction. The dividing method includes a dicing tape sticking step of sticking a dicing tape to the workpiece, a first laser processing step of holding a side of the dicing tape on a holding table and irradiating the workpiece with a laser beam with such a wavelength as to be absorbed by the workpiece along the first direction to form first laser-processed grooves, a first expanding step of expanding the dicing tape in the second direction to enlarge the width of the first laser-processed grooves after carrying out the first laser processing step, a second laser processing step of irradiating the workpiece with the laser beam with such a wavelength as to be absorbed by the workpiece along the second direction to form second laser-processed grooves after carrying out the first expanding step, and a second expanding step of expanding the dicing tape in the first direction to enlarge the width of the second laser-processed grooves after carrying out the second laser processing step.

In accordance with another aspect of the present invention, there is provided laser processing apparatus including workpiece holding means that holds a workpiece supported by an annular frame with the intermediary of a dicing tape, laser beam irradiation means that irradiates the workpiece held by the workpiece holding means with a laser beam, and imaging means that images the workpiece. The laser processing apparatus includes frame holding means that holds the frame, movement means for relatively separating the frame holding means and the workpiece and expanding the dicing tape, and heating means for applying heat to a region between the workpiece on the dicing tape and the frame and shrinking the region.

According to the dividing method of the present invention, even when debris generated in the execution of the first laser processing step or the second laser processing step enters the first laser-processed groove or the second laser-processed groove, it is possible to prevent the possibility of joining of cut pieces obtained by the dividing due to the debris and completely divide the workpiece because the width of the first laser-processed grooves is expanded in the second direction by the first expanding step and the width of the second laser-processed grooves is expanded in the first direction by the second expanding step.

According to the laser processing apparatus of the present invention, after the first laser-processed grooves are formed in the workpiece, the first laser-processed grooves can be enlarged by expanding the dicing tape by the movement means while keeping the held state of the workpiece by the workpiece holding means and the frame holding means. In addition, after the second laser-processed grooves are formed in the workpiece, the second laser-processed grooves can be enlarged by expanding the dicing tape by the movement means while keeping the held state of the workpiece by the workpiece holding means and the frame holding means. Therefore, for example, even when debris generated in the laser processing of the workpiece having the pattern enters the first laser-processed groove or the second laser-processed groove, it is possible to prevent the possibility of joining of the chips obtained by the dividing due to the debris and completely divide the workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

1 First Embodiment

Figure 1:
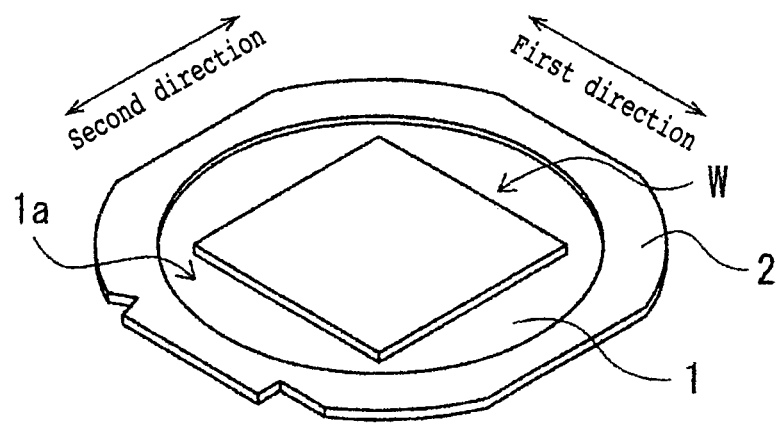
FIG. 1 is a perspective view depicting a dicing tape sticking step of a first embodiment.

A workpiece W depicted in FIG. 1 has a heat dissipation substrate for light-emitting diodes (LEDs) with a rectangular plate shape, for example. In the example depicted in the diagram, on the upper surface of the workpiece W, devices such as LEDs are not formed and a pattern is not formed. The material of the substrate that forms the workpiece W is a metal composed of copper or tungsten, for example. In the following, description will be made about a dividing method of a workpiece in which the workpiece W is divided into predetermined dimensions marked out based on a first direction and a second direction.

(1) Dicing Tape Sticking Step

As depicted in FIG. 1, the peripheral part of a dicing tape 1 having adhesiveness is stuck to the lower surface of an annular frame 2 whose central part is opened, and the workpiece W is stuck to the dicing tape 1 exposed from the central part of the frame 2. Thereby, the frame 2 and the workpiece W are integrally formed with the intermediary of the dicing tape 1. The region in which the dicing tape 1 is exposed in a ring manner between the outer circumferential side of the workpiece W and the inside of the frame 2 is an exposed part 1a. As the dicing tape 1, a tape that can be stretched and thermally shrinks due to heat equal to or higher than a predetermined temperature is used.

(2) First Laser Processing Step

Figure 2:
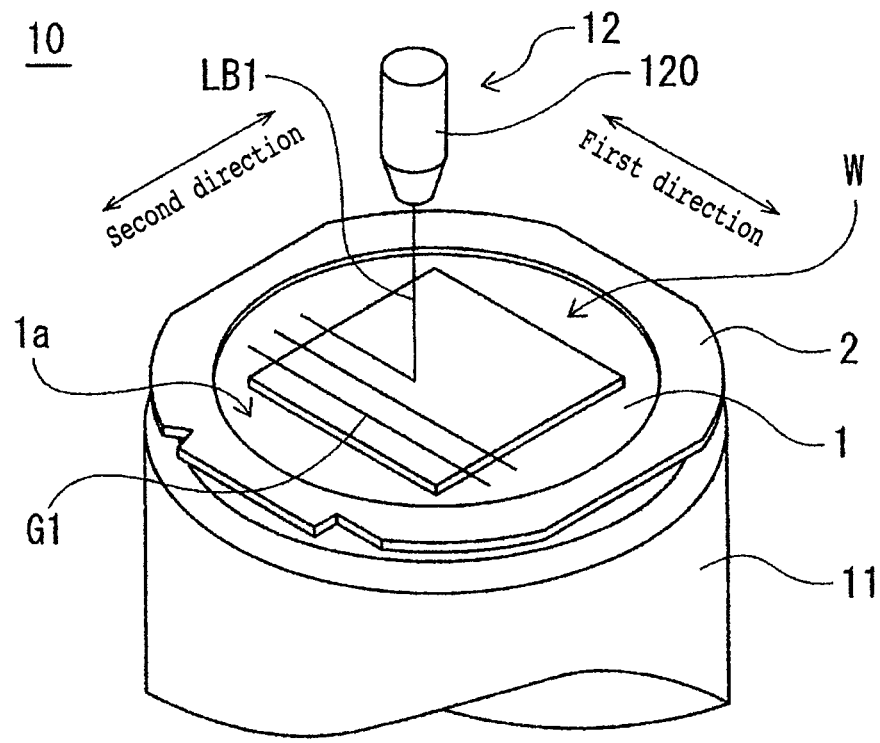
FIG. 2 is a perspective view depicting a first laser processing step of the first embodiment.

As depicted in FIG. 2, the workpiece W integrated with the frame 2 with the intermediary of the dicing tape 1 is conveyed to laser processing apparatus 10, for example. The laser processing apparatus 10 includes at least a holding table 11 that holds the workpiece and can rotate and laser beam irradiation means 12 disposed on the upper side of the holding table 11. To the lower side of the holding table 11, movement means that causes the holding table 11 and the laser beam irradiation means 12 to relatively move in horizontal directions (first direction and second direction) orthogonal to the vertical direction is connected. Furthermore, a suction source, which is not depicted in the diagram, and a clamp mechanism for holding the frame 2 are connected to the holding table 11. The laser beam irradiation means 12 has a laser processing head 120 that emits a laser beam downward. To the laser processing head 120, an oscillator that oscillates a laser beam LB1 with such a wavelength as to be absorbed by the workpiece W and an output power adjuster that adjusts the output power of the laser beam LB1 are connected. Inside the laser processing head 120, a collecting lens for focusing the laser beam LB1 oscillated from the oscillator is incorporated. The laser processing head 120 is movable in the vertical direction and can adjust the focusing position of the laser beam LB1.

When laser processing is carried out for the workpiece W by using the laser processing apparatus 10 configured in this manner, the workpiece W is held by suction in the holding table 11 through the dicing tape 1. In addition, the upper part of the frame 2 is held by the clamp mechanism and the frame 2 is fixed so as to be immobile. Then, the position of the laser processing head 120 in the second direction is aligned with the position to be irradiated with the laser beam. In addition, the laser processing head 120 is lowered in such a direction as to come closer to the workpiece W and the focusing point of the laser beam LB1 is positioned at a desired position. The output power of the laser beam LB1 is adjusted to output power at such a level that the dicing tape 1 does not melt, and is set in the output power adjuster.

Figure 3:
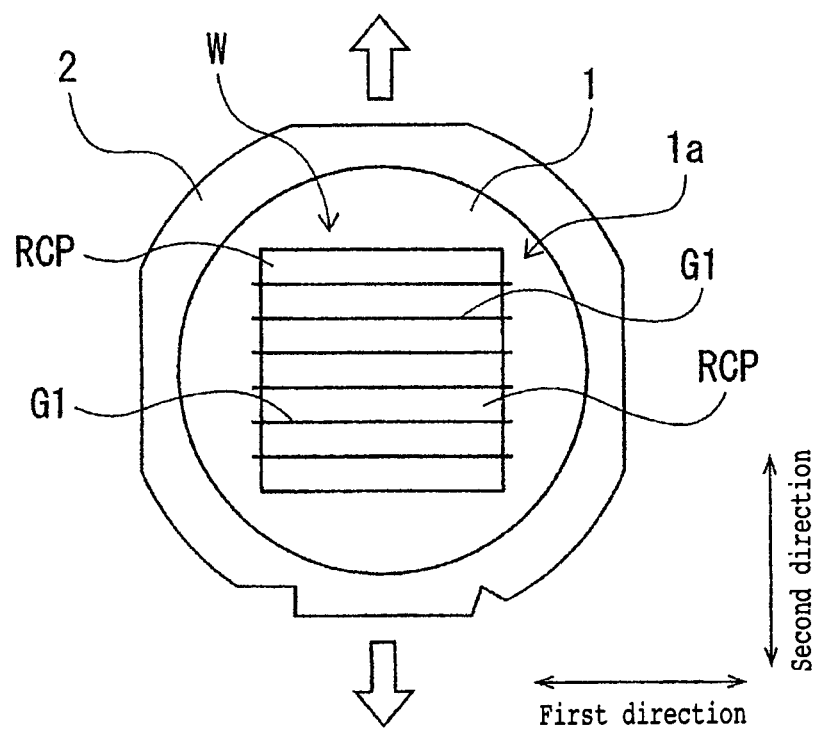
FIG. 3 is a plan view depicting a workpiece in which first laser-processed grooves are formed.

Subsequently, while the holding table 11 is horizontally moved in e.g. the first direction by the movement means to relatively move the laser processing head 120 and the holding table 11 in the first direction parallel to the workpiece W, the laser beam LB1 is emitted from the laser processing head 120 toward the workpiece W. Thereby, a first laser-processed groove G1 is formed in the workpiece W. The depth of the first laser-processed groove G1 is at such a level that the dicing tape 1 is exposed and it suffices that the first laser-processed groove G1 is a groove that completely cuts (fully cuts) the front and back surfaces of the workpiece W. The first laser-processed groove G1 is formed by emitting the laser beam LB1 along the first direction plural times in a divided manner. After the first laser-processed groove G1 of the first row oriented in the first direction is formed in this manner, the holding table 11 is horizontally moved in the second direction by the movement means and the laser processing head 120 is positioned at a position at a predetermined interval. Then, the first laser-processed groove G1 is formed in the workpiece W by emitting the laser beam LB1 from the laser processing head 120 toward the workpiece W while relatively moving the laser processing head 120 and the holding table 11 in the first direction parallel to the workpiece W similarly to the above description. Then, with indexing feed of the laser processing head 120 in the second direction by a predetermined amount for every indexing feed, a predetermined number of first laser-processed grooves G1 are formed in the workpiece W along the first direction as depicted in FIG. 3. Thereby, the workpiece W is divided into plural cut pieces RCP having a thin strip shape.

(3) First Expanding Step

Figure 4A:
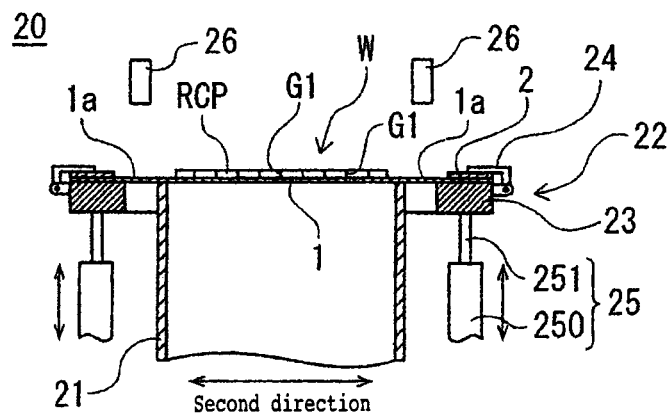
FIGS. 4A to 4D are sectional views depicting a first expanding step of the first embodiment.

After the first laser processing step is carried out, the workpiece W is conveyed from the laser processing apparatus 10 to expanding apparatus 20 depicted in FIG. 4A, for example. The expanding apparatus 20 includes a support table 21 that supports the workpiece W, plural frame holding means 22 that are disposed around the support table 21 and hold the frame 2, movement means 25 that raise and lower the frame holding means 22 in the upward and downward directions, and heating means 26 for applying heat to the exposed part 1a in the region between the workpiece W on the dicing tape 1 and the frame 2 to shrink the exposed part 1a. The frame holding means 22 includes a frame placement base 23 that is disposed on the outer circumferential side of the support table 21 and on which the frame 2 is placed and a clamp part 24 that clamps the frame 2 placed on the frame placement base 23. The movement means 25 includes a cylinder 250 and a piston 251 driven to be raised and lowered by the cylinder 250 and can raise and lower the frame placement base 23 by the upward and downward movement of the piston 251. The heating means 26 is not particularly limited. It may be a heater that injects hot air at a predetermined temperature or may be an infrared heater that radiates an infrared ray.

Figure 4B:
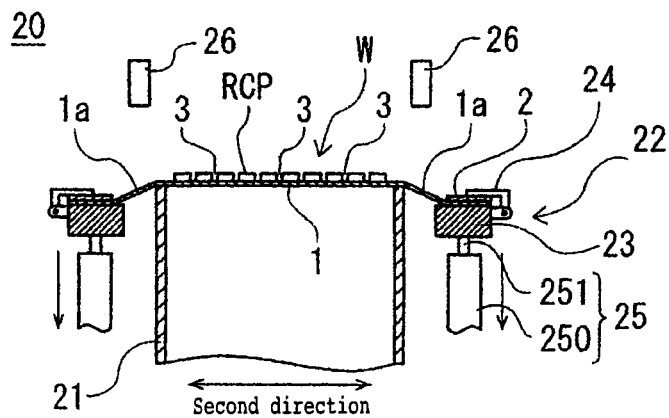

As depicted in FIG. 4A, the side of the workpiece W is placed over the support table 21 with the intermediary of the dicing tape 1 and the frame 2 is placed on the frame placement bases 23. At this time, the clamp parts 24 hold the upper part of the frame 2 and fix the frame 2 so that the frame 2 may be immobile. Subsequently, as depicted in FIG. 4B, the pistons 251 move downward to lower the frame placement bases 23 relatively to the support table 21 and expand the dicing tape 1 in the second direction orthogonal to the first direction. Due to this, the dicing tape 1 is stretched in the state in which the exposed part 1a is inclined from the outer circumference of the support table 21 toward the frame 2. In addition, the unexposed part to which the workpiece W is stuck in the dicing tape 1 is stretched in the second direction, so that an external force in the second direction is given to the workpiece W. As a result, the width of the first laser-processed grooves G1 depicted in FIG. 4A is enlarged in the second direction and gaps 3 are formed between adjacent cut pieces RCP. Due to this, even when debris generated in the first laser processing step enters the first laser-processed groove G1, it is possible to prevent the possibility of joining of cut pieces obtained by dividing into predetermined dimensions finally due to the debris because the width of the first laser-processed grooves G1 is expanded by the first expanding step.

Figure 4C:
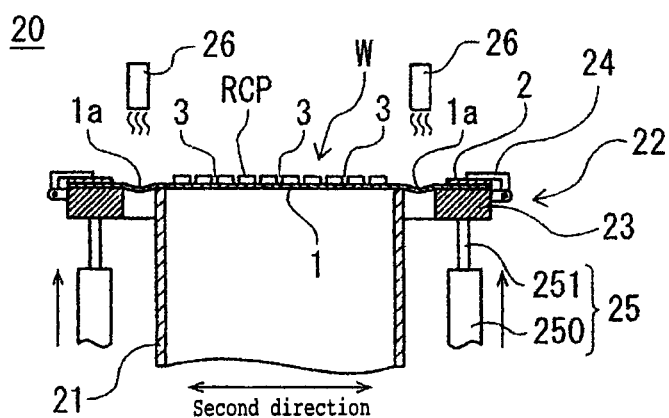
Figure 4D:
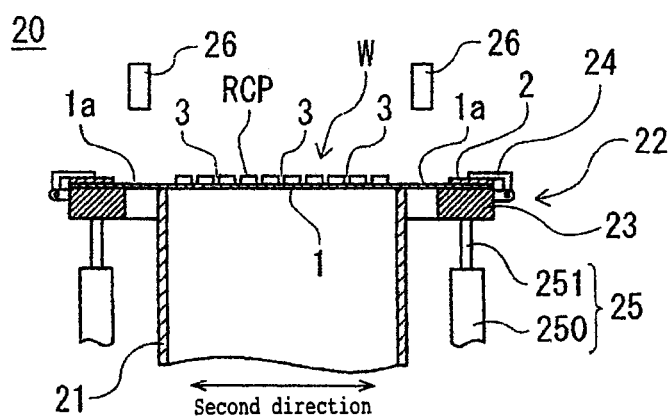

If the gaps 3 between the respective cut pieces RCP have a desired width, the pistons 251 move upward to return the frame placement bases 23 to the original positions as depicted in FIG. 4C. At this time, flexures are generated in the exposed part 1a of the dicing tape 1 and thus the exposed part 1a is heated by the heating means 26. Specifically, the heating means 26 heats the exposed part 1a by injecting e.g. hot air at a predetermined temperature toward the exposed part 1a and thermally shrinks the exposed part 1a. Due to this, as depicted in FIG. 4D, the dicing tape 1 becomes the state of being stretched in parallel to the support table 21 and the frame placement bases 23. Thus, the flexures disappear in the thermally-shrunk exposed part 1a and the expanded width of the first laser-processed grooves G1 can be kept. That is, the respective gaps 3 between adjacent cut pieces RCP can be kept.

Here, if the dicing tape 1 has been excessively stretched after the first expanding step is carried out and before a second laser processing step to be described later is carried out, there is a possibility that it is impossible to hold the workpiece W by suction through the dicing tape 1 in the above-described holding table 11 and therefore it is preferable to convey the workpiece W integrated with the frame 2 with the intermediary of the dicing tape 1 to e.g. tape sticking apparatus and change the excessively-stretched dicing tape 1 to a new dicing tape.

(4) Second Laser Processing Step

Figure 5:
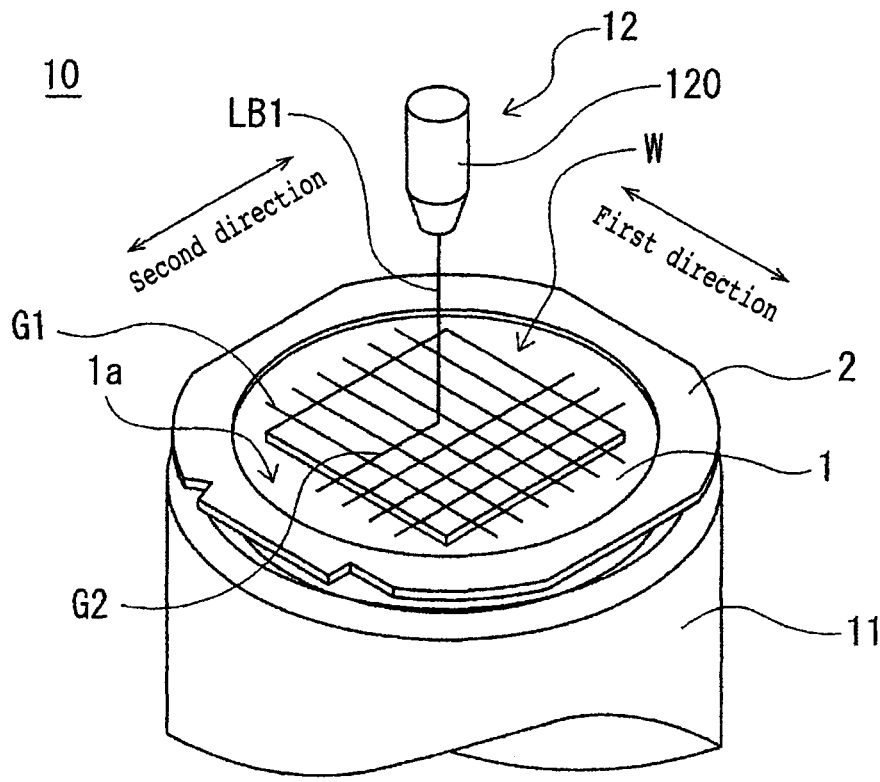
FIG. 5 is a perspective view depicting a second laser processing step of the first embodiment.

After the first expanding step is carried out, as depicted in FIG. 5, the workpiece W integrated with the frame 2 with the intermediary of the dicing tape 1 is conveyed to the laser processing apparatus 10 again. Specifically, similarly to the first laser processing step, the workpiece W is held by suction in the holding table 11 through the dicing tape 1. In addition, the upper part of the frame 2 is held by the clamp mechanism and the frame 2 is fixed so as to be immobile. Then, the position of the laser processing head 120 in the first direction is aligned with the position to be irradiated with the laser beam. In addition, the laser processing head 120 is lowered in such a direction as to come closer to the workpiece W and the focusing point of the laser beam LB1 is positioned at the height position of the upper surface of the workpiece W.

Subsequently, while the holding table 11 is horizontally moved in e.g. the second direction by the movement means to relatively move the laser processing head 120 and the holding table 11 in the second direction parallel to the workpiece W, the laser beam LB1 is emitted from the laser processing head 120 toward the workpiece plural times in a divided manner. Thereby, a second laser-processed groove G2 is formed in the workpiece W. The second laser-processed groove G2 is also a groove that completely cuts the front and back surfaces of the workpiece W similarly to the first laser-processed groove G1. In this manner, as depicted in FIG. 6, a predetermined number of second laser-processed grooves G2 are formed in the workpiece W along the second direction and thereby the workpiece W is divided into plural cut pieces CP having desired dimensions.

(5) Second Expanding Step

Figure 6:
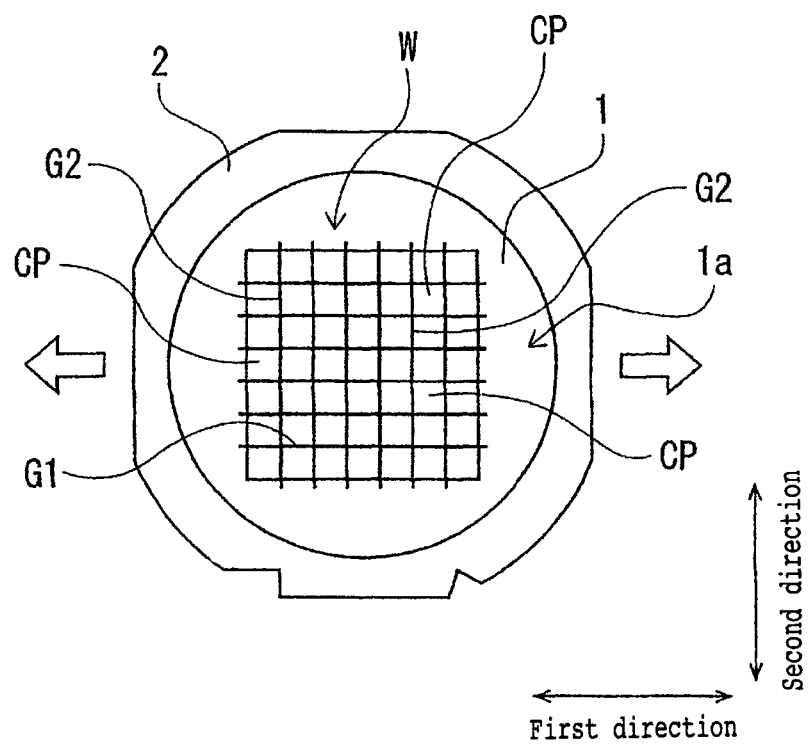
FIG. 6 is a plan view that depicts the workpiece in which second laser-processed grooves are formed and depicts a second expanding step of the first embodiment.

After the second laser processing step is carried out, similarly to the first expanding step, the workpiece W is conveyed from the laser processing apparatus 10 to the expanding apparatus 20 and the width of the second laser-processed grooves G2 is enlarged by expanding the dicing tape 1 in the first direction orthogonal to the second direction as depicted in FIG. 6. The expansion operation is similarly to the above-described first expanding step. Specifically, the pistons 251 depicted in FIG. 4 move downward to lower the frame placement bases 23 relatively to the support table 21 and expand the dicing tape 1 in the first direction. Due to this, the dicing tape 1 is stretched in the state in which the exposed part 1a is inclined from the outer circumference of the support table 21 toward the frame 2, and the unexposed part to which the workpiece W is stuck in the dicing tape 1 is stretched in the first direction, so that an external force in the first direction is given to the workpiece W. As a result, the width of the second laser-processed grooves G2 is enlarged in the first direction and gaps are formed between adjacent cut pieces CP. Due to this, even when debris generated in the second laser processing step enters the second laser-processed groove G2, it is possible to prevent the possibility of joining of the cut pieces CP obtained by the dividing due to the debris because the width of the second laser-processed grooves G2 is expanded by the second expanding step. In this manner, the workpiece W is completely divided to acquire the individual cut pieces CP. In order to keep the gaps between the respective cut pieces CP, the exposed part 1a may be heated to be thermally shrunk by the heating means 26 similarly to the first expanding step.

In the first embodiment, the case is described in which the dicing tape 1 is expanded by lowering the frame 2 together with the frame placement bases 23 by the movement means 25. However, the configuration is not limited thereto. A raising/lowering mechanism may be provided on the side of the support table 21 and the side of the support table 21 may be raised to relatively separate the frame 2 and the support table 21 and expand the dicing tape 1. Furthermore, although the case in which the workpiece W is supported by the annular frame 2 is described in the first embodiment, the configuration is not limited to this case. Therefore, the workpiece W may be directly stuck to the dicing tape 1 without using the frame 2. In this case, for example, the workpiece W may be divided by using expanding apparatus that can clamp the four sides of the dicing tape 1 and pull the dicing tape 1 and clamping the four sides of the dicing tape 1 to expand the dicing tape 1 in a radial manner.

As above, the dividing method of a workpiece according to the present invention includes the dicing tape sticking step of sticking the dicing tape 1 to the workpiece W, the first laser processing step of holding the side of the dicing tape 1 on the holding table 11 and irradiating the workpiece W with the laser beam LB1 with such a wavelength as to be absorbed by the workpiece W along the first direction to form the first laser-processed grooves G1, the first expanding step of expanding the dicing tape 1 in the second direction to enlarge the width of the first laser-processed grooves G1, the second laser processing step of irradiating the workpiece W with the laser beam LB1 with such a wavelength as to be absorbed by the workpiece W along the second direction to form the second laser-processed grooves G2 after carrying out the first expanding step, and the second expanding step of expanding the dicing tape 1 in the first direction to enlarge the width of the second laser-processed grooves G2 after carrying out the second laser processing step. Therefore, even when debris generated in the execution of the first laser processing step or the second laser processing step enters the first laser-processed groove G1 or the second laser-processed groove G2, it is possible to prevent the possibility of joining of the cut pieces CP obtained by the dividing due to the debris and completely divide the workpiece W because the width of the first laser-processed grooves G1 is expanded in the second direction by the first expanding step and the width of the second laser-processed grooves G2 is expanded in the first direction by the second expanding step.

2 Second Embodiment

In the above-described first embodiment, the case in which the laser processing and the expansion of the dicing tape 1 are carried out by separate pieces of apparatus is described. However, the configuration is not limited thereto. For example, by using laser processing apparatus 30 depicted in FIG. 7, laser processing for a workpiece W1 depicted in FIG. 8 and expansion of a dicing tape 4 may be carried out by the same apparatus. The laser processing apparatus 30 has an apparatus base 31 and includes the following means over the apparatus base 31: workpiece holding means 40 that holds the workpiece W1 integrated with an annular frame 5 with the intermediary of the dicing tape 4; frame holding means 41 that are disposed around the workpiece holding means 40 and hold the frame 5; movement means 42 for relatively separating the frame holding means 41 and the workpiece W1 and expanding the dicing tape 4; processing feed means 43 that carries out processing feed of the workpiece holding means 40 in an X-axis direction; first indexing feed means 44 that carries out indexing feed of the workpiece holding means 40 in a Y-axis direction; laser beam irradiation means 45 that irradiates the workpiece W1 held by the workpiece holding means 40 with a laser beam; imaging means 48 that images the workpiece W1; heating means 49 that applies heat to the region between the workpiece W1 on the dicing tape 4 and the frame 5 and thermally shrinks the region; second indexing feed means 46 that carries out indexing feed of the laser beam irradiation means 45 in the Y-axis direction; and raising/lowering means 47 that raises and lowers the laser beam irradiation means 45 in a Z-axis direction.

Figure 8:
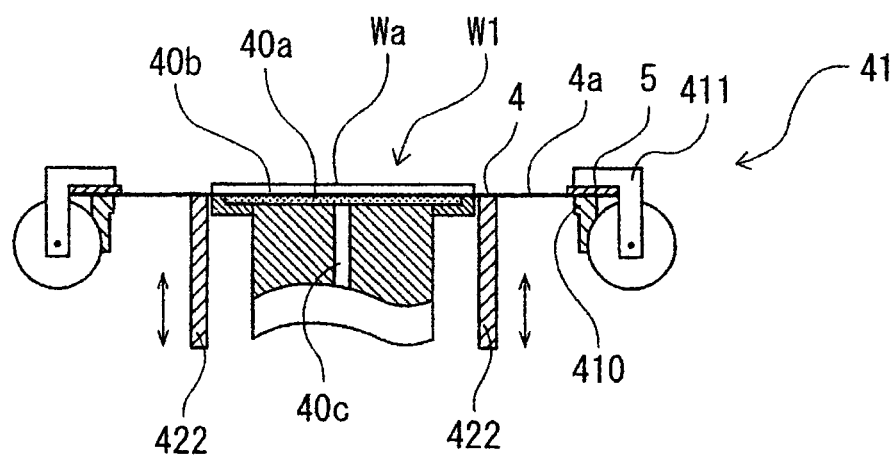
FIG. 8 is a sectional view depicting the configuration of workpiece holding means and frame holding means.

The workpiece holding means 40 is fixed onto a cover table 400 having an opening part 400a and rotation means 401 is connected to the lower part of the workpiece holding means 40. The rotation means 401 can rotate the workpiece holding means 40 by a predetermined angle. As depicted in FIG. 8, the workpiece holding means 40 has a holding part 40a formed of a porous member and the upper surface of the holding part 40a serves as a holding surface 40b that holds the workpiece W1 by suction. A suction source, which is not depicted in the diagram, is connected to the holding part 40a through a suction path 40c. The workpiece holding means 40 can hold the workpiece W1 by suction by the holding surface 40b on which a suction force by the suction source is made to act. The frame holding means 41 includes a frame placement base 410 on which the frame 5 is placed on the outer circumferential side of the workpiece holding means 40 and a clamp part 411 that clamps the frame 5 placed on the frame placement base 410.

Figure 7:
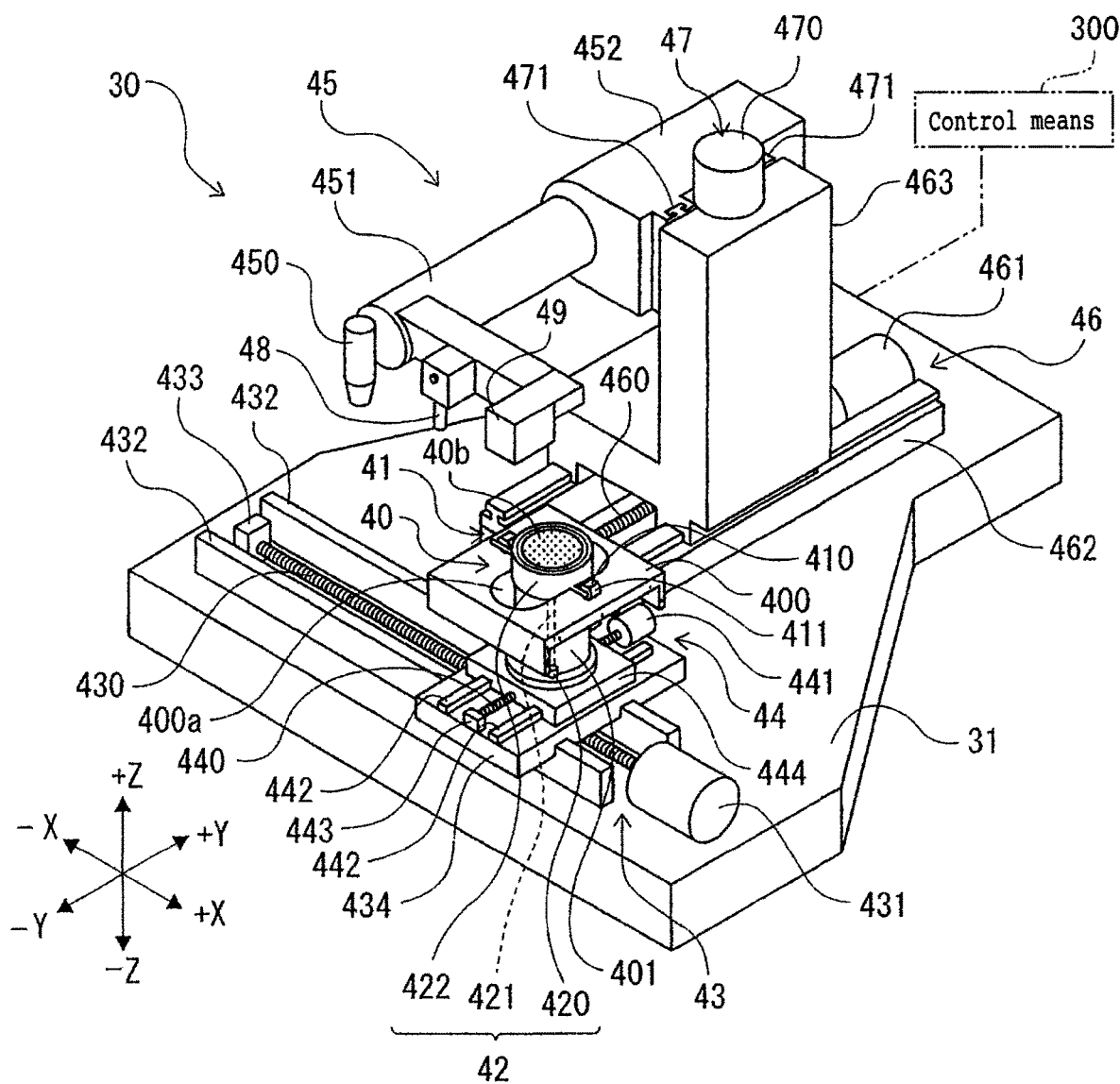
FIG. 7 is a perspective view depicting the configuration of one example of laser processing apparatus.

As depicted in FIG. 7, the movement means 42 includes a cylinder 420, a piston 421 driven to be raised and lowered by the cylinder 420, and an expanding member 422 that is connected to the tip of the piston 421 and surrounds the workpiece holding means 40. By the upward and downward movement of the piston 421, the expanding member 422 can be raised and lowered inside the opening part 400a of the cover table 400. With the workpiece holding means 40 and the frame holding means 41, in the state in which the workpiece W1 in the state of being integrated with the frame 5 with the intermediary of the dicing tape 4 is held by the workpiece holding means 40 and the frame 5 is held by the frame holding means 41, the dicing tape 4 can be expanded in a radial manner by raising the expanding member 422 through the rise of the piston 421 and pushing up the dicing tape 4 by the tip part of the expanding member 422. Although the case in which two units are disposed on the outer circumferential side of the workpiece holding means 40 as the frame holding means 41 depicted in the present embodiment is diagrammatically represented, the number of frame holding means 41 is not limited to this number.

The processing feed means 43 includes a ball screw 430 that extends along the X-axis direction, a motor 431 connected to one end of the ball screw 430, a pair of guide rails 432 that extend in parallel to the ball screw 430, a bearing part 433 that supports the other end of the ball screw 430 rotatably, and a movement base 434 that supports the workpiece holding means 40. One surface of the movement base 434 is in slidable contact with the pair of guide rails 432 and the ball screw 430 is screwed to a nut formed at the central part of the movement base 434. When the motor 431 rotates the ball screw 430, the movement base 434 moves in the X-axis direction along the guide rails 432, which can move the workpiece holding means 40 in the X-axis direction.

The first indexing feed means 44 includes a ball screw 440 that extends along the Y-axis direction, a motor 441 connected to one end of the ball screw 440, a pair of guide rails 442 that extend in parallel to the ball screw 440, a bearing part 443 that supports the other end of the ball screw 440 rotatably, and a movement base 444 that supports the workpiece holding means 40. One surface of the movement base 444 is in slidable contact with the pair of guide rails 442 and the ball screw 440 is screwed to a nut formed at the central part of the movement base 444. When the motor 441 rotates the ball screw 440, the movement base 444 moves in the Y-axis direction along the guide rails 442, which can move the workpiece holding means 40 in the Y-axis direction.

The second indexing feed means 46 includes a ball screw 460 that extends along the Y-axis direction, a motor 461 connected to one end of the ball screw 460, a pair of guide rails 462 that extend in parallel to the ball screw 460, and a movable support part 463 that supports the laser beam irradiation means 45 and has a substantially L shape as the sectional shape. The lower surface of the movable support part 463 is in slidable contact with the pair of guide rails 462 and the ball screw 460 is screwed to a nut formed at the lower part of the movable support part 463. The motor 461 rotates the ball screw 460 and thereby the movable support part 463 moves in the Y-axis direction while being guided by the guide rails 462, which can move the laser beam irradiation means 45 in the Y-axis direction.

The raising/lowering means 47 includes a ball screw that extends along the Z-axis direction and is not depicted in the diagram, a motor 470 connected to one end of the ball screw, and a pair of guide rails 471 that extend in parallel to the ball screw. The motor 470 rotates the ball screw, which can raise and lower the laser beam irradiation means 45 in the Z-axis direction.

The laser beam irradiation means 45 includes a laser processing head 450 that emits a laser beam in the vertical direction to the workpiece W1 held by the workpiece holding means 40, a casing 451 having a tip to which the laser processing head 450 is attached, and a holder 452 that horizontally supports the casing 451. The casing 451 has a configuration in which the tip part thereof extends to a position on the upper side of the movement path in the movement direction (X-axis direction) of the workpiece holding means 40. Inside the casing 451, an oscillator that oscillates the laser beam with such a wavelength as to be absorbed by the workpiece W1 and an output power adjuster that adjusts the output power of the laser beam are housed. Inside the laser processing head 450, a collecting lens for focusing the laser beam oscillated from the oscillator is incorporated. The laser processing head 450 can move upward and downward in association with the movement of the casing 451 in the upward and downward directions by the raising/lowering means 47 and adjust the focusing position of the laser beam.

The imaging means 48 is a camera in which a charge-coupled device (CCD) image sensor or a complementary metal-oxide semiconductor (CMOS) image sensor is incorporated, for example. The imaging means 48 can detect the position that should be irradiated with the laser beam on the workpiece W1 by imaging the workpiece W1 held by the workpiece holding means 40 and executing image processing such as pattern matching. The heating means 49 is not particularly limited. It may be a heater that injects hot air at a predetermined temperature or may be an infrared heater that radiates an infrared ray.

The laser processing apparatus 30 includes control means 300 that controls at least the workpiece holding means 40, the frame holding means 41, the movement means 42, the processing feed means 43, the first indexing feed means 44, the laser beam irradiation means 45, the second indexing feed means 46, the raising/lowering means 47, the imaging means 48, and the heating means 49. The control means 300 includes a central processing unit (CPU) that executes arithmetic processing by a control program and a storing element such as a memory. Data necessary for control of various kinds of drive mechanisms is stored in the storing element and the control means 300 controls these respective drive mechanisms. When the position that should be irradiated with the laser beam on the workpiece W1 is detected by the imaging means 48, this detection data is sent to the control means 300. Based on the detection data, the control means 300 can control rotational operation of the workpiece holding means 40, movement operation of the workpiece holding means 40 by the processing feed means 43 and the first indexing feed means 44, and movement operation of the laser beam irradiation means 45 by the second indexing feed means 46. Position alignment between the position of the laser processing head 450 and the position that should be irradiated with the laser beam is carried out by indexing feed of the workpiece holding means 40 together with the movement base 444 in the Y-axis direction by the first indexing feed means 44 or by indexing feed of the laser beam irradiation means 45 together with the movable support part 463 in the Y-axis direction by the second indexing feed means 46.

Figure 9:
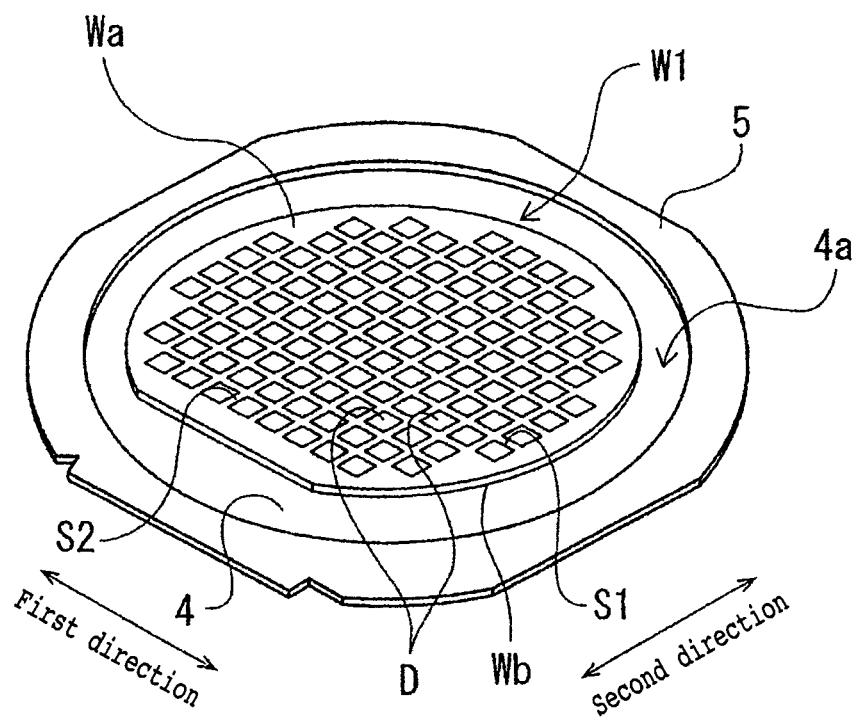
FIG. 9 is a perspective view depicting a dicing tape sticking step of a second embodiment.

Next, as an operation example of the laser processing apparatus 30, a dividing method of a workpiece in which the workpiece W1 is divided by using the laser processing apparatus 30 will be described. As depicted in FIG. 9, the workpiece W1 has a substrate having a circular disc shape. On a front surface Wa thereof, devices D are formed in the respective regions marked out by plural first planned dividing lines S1 that extend along a first direction and plural second planned dividing lines S2 that extend along a second direction orthogonal to the first direction, for example. On the other hand, the surface on the opposite side to the front surface Wa of the workpiece W1 is a stuck surface to which the dicing tape 4 is stuck.

(1) Dicing Tape Sticking Step

First, as depicted in FIG. 9, the dicing tape 4 is stuck to the lower surface of the frame 5 and the workpiece W1 is stuck to the dicing tape 4 exposed from the central part of the frame 5 from the side of a back surface Wb. Due to this, in the state in which the side of the front surface Wa is exposed upward in the workpiece W1, the frame 5 and the workpiece W1 are integrally formed with the intermediary of the dicing tape 4. The region in which the dicing tape 4 is exposed in a ring manner between the outer circumferential side of the workpiece W1 and the inside of the frame 5 is an exposed part 4a. Subsequently, the side of the workpiece W1 is placed over the holding surface 40b of the workpiece holding means 40 depicted in FIG. 8 with the intermediary of the dicing tape 4. In addition, the frame 5 is placed on the frame placement bases 410 of the frame holding means 41. At this time, the clamp parts 411 hold the upper part of the frame 5 and fix the frame 5 so that the frame 5 may be immobile.

(2) First Planned Dividing Line Detecting Step

The workpiece holding means 40 is positioned below the imaging means 48 by the processing feed means 43 depicted in FIG. 7, and the workpiece W1 is imaged and image processing such as pattern matching is executed by the imaging means 48. Thereby, alignment to detect the position that should be irradiated with the laser beam (first planned dividing line S1) is carried out. In the first planned dividing line detecting step, all first planned dividing lines S1 may be detected. However, it suffices to detect the first one line with which laser processing is started because the widths of the first planned dividing lines S1 and the second planned dividing lines S2 have not been expanded. The detection data detected by the imaging means 48 is sent to the control means 300.

(3) First Laser Processing Step

Figure 10:
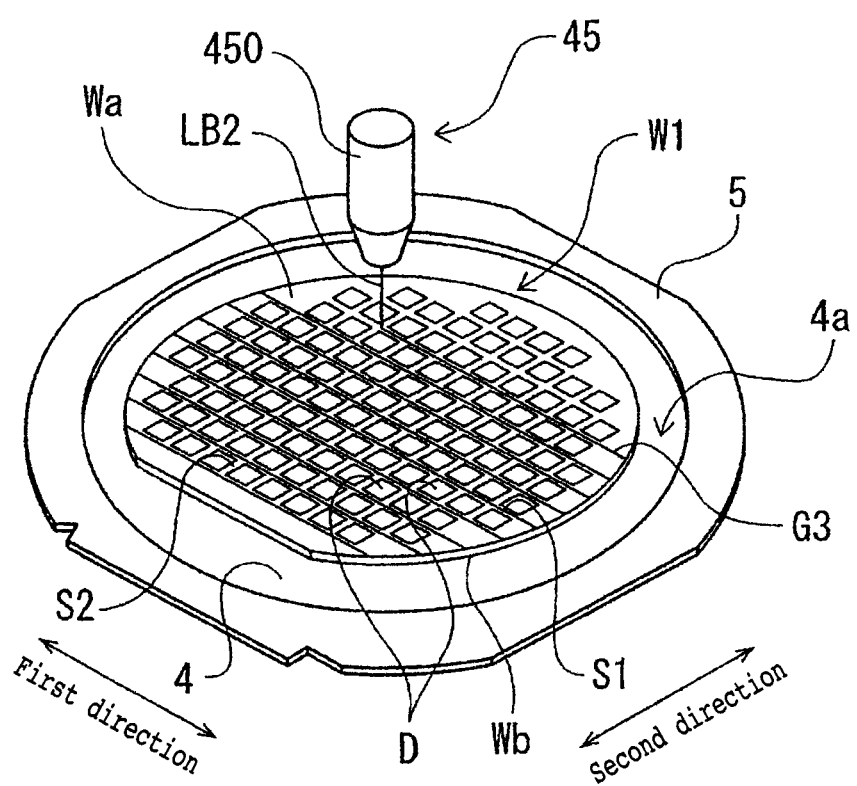
FIG. 10 is a perspective view depicting a first laser processing step of the second embodiment.

By carrying out the first planned dividing line detecting step, position alignment between the laser processing head 450 and the detected first planned dividing line S1 is carried out. Subsequently, as depicted in FIG. 10, the laser beam irradiation means 45 lowers the laser processing head 450 in such a direction as to come closer to the workpiece W1 and adjusts the focusing point of a laser beam LB2 to the height position of the front surface Wa of the workpiece W1. The output power of the laser beam LB2 is adjusted to output power at such a level that the dicing tape 4 does not melt, and is set in the output power adjuster.

Subsequently, while the workpiece holding means 40 depicted in FIG. 7 is horizontally moved in e.g. the −X direction by the processing feed means 43 to relatively move the laser processing head 450 and the workpiece W1 in the first direction parallel to the workpiece W1 as depicted in FIG. 10, the laser beam LB2 having such a wavelength as to be absorbed by the workpiece W1 is emitted from the laser processing head 450 along the first planned dividing line S1. Thereby, a first laser-processed groove G3 is formed in the workpiece W1. The depth of the first laser-processed groove G3 is at such a level that the dicing tape 4 is exposed and it suffices that the first laser-processed groove G3 is a groove that completely cuts (fully cuts) the front and back surfaces of the workpiece W1. The first laser-processed groove G3 is formed by emitting the laser beam LB2 along the first planned dividing line S1 plural times in a divided manner.

After the first laser-processed groove G3 is formed along the first planned dividing line S1 of one row oriented in the first direction, indexing feed of the laser processing head 450 is carried out in the Y-axis direction by the second indexing feed means 46 depicted in FIG. 7 and the laser processing head 450 is positioned on the upper side of the adjacent first planned dividing line S1. Then, the first laser-processed groove G3 is formed by emitting the laser beam LB2 from the laser processing head 450 along the first planned dividing line S1 while moving the workpiece holding means 40 in e.g. the −X direction by the processing feed means 43 similarly to the above description. When the first laser-processed grooves G3 are formed along all first planned dividing lines S1, the first laser processing step is completed.

(4) First Expanding Step

Figure 11A:
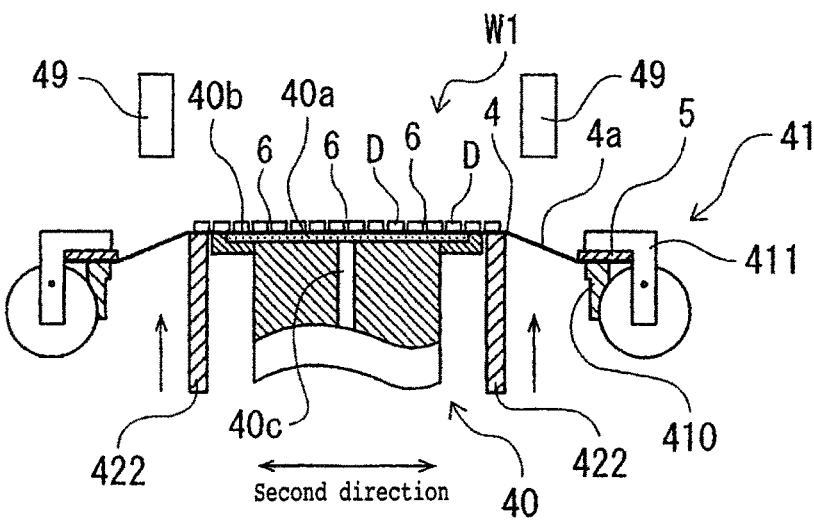
FIGS. 11A to 11C are sectional views depicting a first expanding step of the second embodiment.

After the first laser processing step is carried out, the width of the first laser-processed grooves G3 is enlarged by expanding the dicing tape 4 in the second direction orthogonal to the first direction while keeping the held state of the workpiece W1 by the workpiece holding means 40 and the frame holding means 41. Specifically, the piston 421 depicted in FIG. 7 moves in the +Z direction, for example. Thereby, as depicted in FIG. 11A, the expanding member 422 is raised to push up the dicing tape 4 by the tip part thereof and relatively separate the frame holding means 41 and the workpiece W1. When the dicing tape 4 is expanded in the second direction due to this, the dicing tape 4 is stretched in the state in which the exposed part 4a is inclined from the outer circumference of the workpiece holding means 40 toward the frame 5. In addition, the unexposed part to which the workpiece W1 is stuck in the dicing tape 4 is stretched in the second direction, so that an external force in the second direction is given to the workpiece W1. As a result, the width of the first laser-processed grooves G3 depicted in FIG. 10 is enlarged in the second direction and gaps 6 are formed between adjacent devices D. Due to this, even when debris generated in the first laser processing step enters the first laser-processed groove G3, it is possible to prevent the possibility of joining of chips obtained by dividing finally due to the debris because the width of the first laser-processed grooves G3 is expanded by the first expanding step.

Figure 11B:
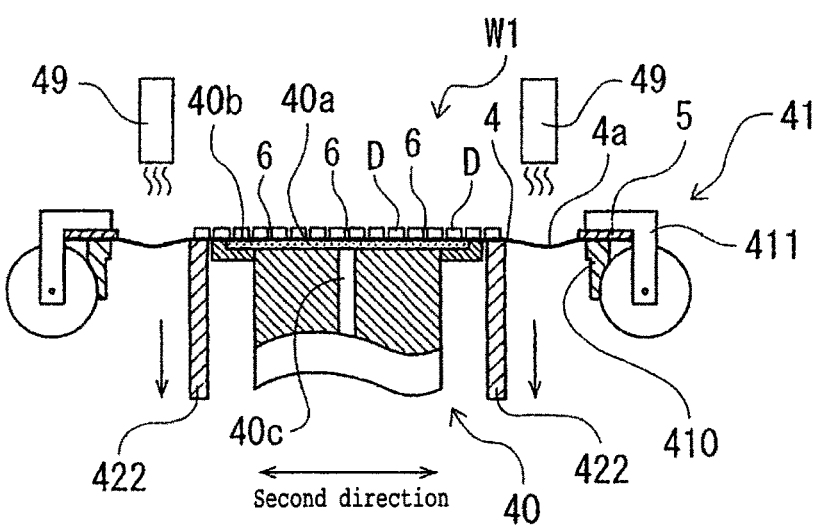
Figure 11C:
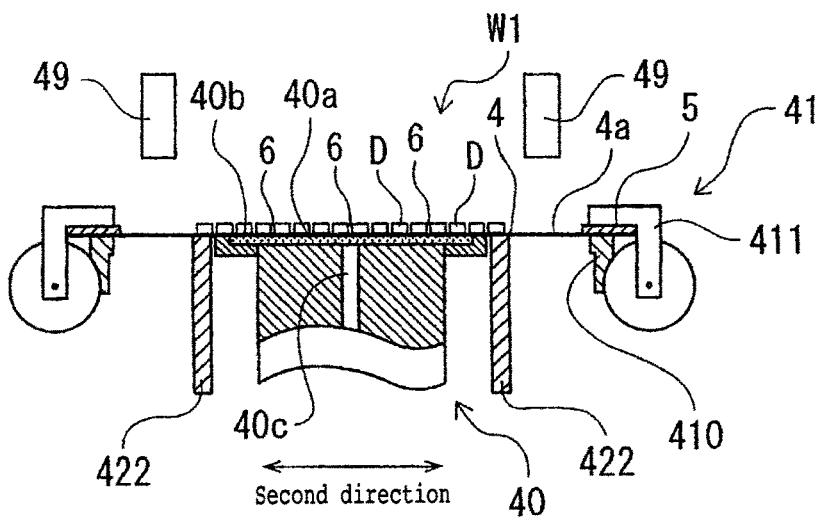

If the gaps 6 between the respective devices D have a desired width, the piston 421 depicted in FIG. 7 moves in e.g. the −Z direction to lower the expanding member 422 depicted in FIG. 11B. At this time, flexures are generated in the exposed part 4a of the dicing tape 4 and thus the exposed part 4a is heated by the heating means 49. The heating means 49 heats the exposed part 4a by injecting e.g. hot air at a predetermined temperature toward the exposed part 4a and thermally shrinks the exposed part 4a. Due to this, as depicted in FIG. 11C, the dicing tape 4 becomes the state of being stretched in parallel to the workpiece holding means 40. Thus, the flexures disappear in the thermally-shrunk exposed part 4a and the expanded width of the first laser-processed grooves G3 can be kept. That is, the respective gaps 6 between adjacent devices D can be kept.

(5) Second Planned Dividing Line Detecting Step

After the first expanding step is carried out, the workpiece holding means 40 is rotated by 90 degrees around the axial center in the Z-axis direction by the rotation means 401 depicted in FIG. 7. Thereby, the second planned dividing lines S2 oriented in the second direction depicted in FIG. 9 are oriented into the X-axis direction and the first planned dividing lines S1 oriented in the first direction are oriented into the Y-axis direction. Subsequently, the workpiece holding means 40 is positioned below the imaging means 48 by the processing feed means 43. Then, the workpiece W1 is imaged and image processing such as pattern matching is executed by the imaging means 48 to carry out alignment to detect the first planned dividing lines S1 along which the first laser-processed grooves G3 are formed and the position that should be irradiated with the laser beam (second planned dividing line S2). In the second planned dividing line detecting step, the width of all first planned dividing lines S1 expanded in association with the expansion of the first laser-processed grooves G3 is detected. In addition, all second planned dividing lines S2 are detected and the detection data is sent to the control means 300. The expanded width of the first planned dividing lines S1 is set in the control means 300 as the indexing feed width of the laser processing head 450 in the Y-axis direction.

(6) Second Laser Processing Step

Figure 12:
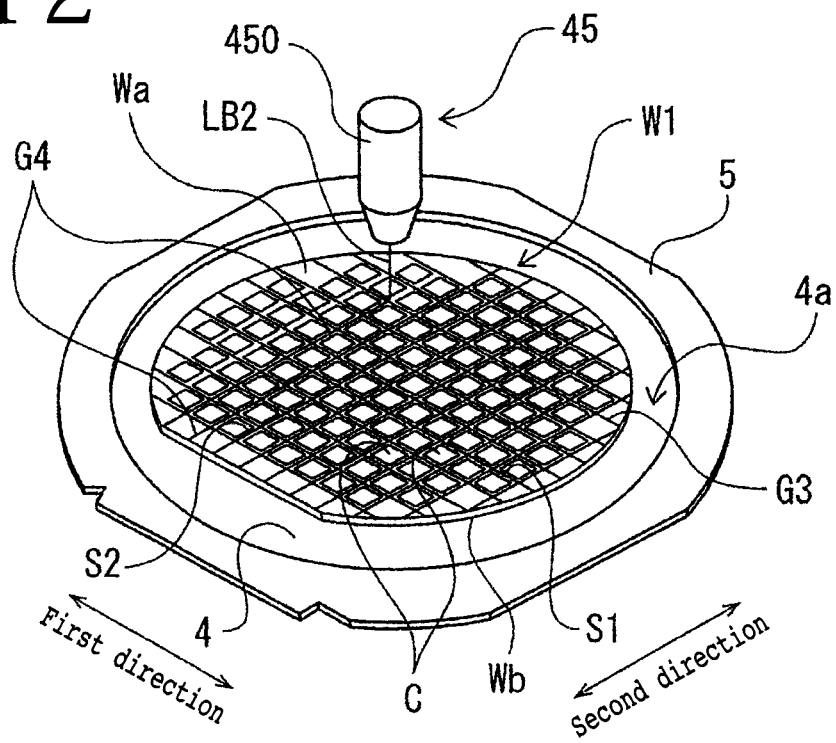
FIG. 12 is a perspective view depicting a second laser processing step of the second embodiment.

By carrying out the second planned dividing line detecting step, position alignment between the laser processing head 450 and the detected second planned dividing line S2 is carried out. The laser beam irradiation means 45 lowers the laser processing head 450 in such a direction as to come closer to the workpiece W1 and adjusts the focusing point of the laser beam LB2 to the height position of the front surface Wa of the workpiece W1. Subsequently, while the workpiece holding means 40 is horizontally moved in e.g. the −X direction to relatively move the laser processing head 450 and the workpiece W1 in the second direction parallel to the workpiece W1 as depicted in FIG. 12, the laser beam LB2 having such a wavelength as to be absorbed by the workpiece W1 is emitted from the laser processing head 450 along the second planned dividing line S2. Thereby, a second laser-processed groove G4 is formed in the workpiece W1. The second laser-processed groove G4 is also a groove that completely cuts the front and back surfaces of the workpiece W1 similarly to the first laser-processed groove G3.

After the second laser-processed groove G4 is formed along the second planned dividing line S2 of one row oriented in the second direction, indexing feed of the laser processing head 450 is carried out in the Y-axis direction by the second indexing feed means 46 depicted in FIG. 7 and the laser processing head 450 is positioned on the upper side of the adjacent second planned dividing line S2. Then, the second laser-processed groove G4 is formed by emitting the laser beam LB2 from the laser processing head 450 along the second planned dividing line S2 while moving the workpiece holding means 40 in e.g. the −X direction by the processing feed means 43 similarly to the above description. When the second laser-processed grooves G4 are formed along all second planned dividing lines S2, the workpiece W1 is divided into plural chips C.

(7) Second Expanding Step

Figure 13:
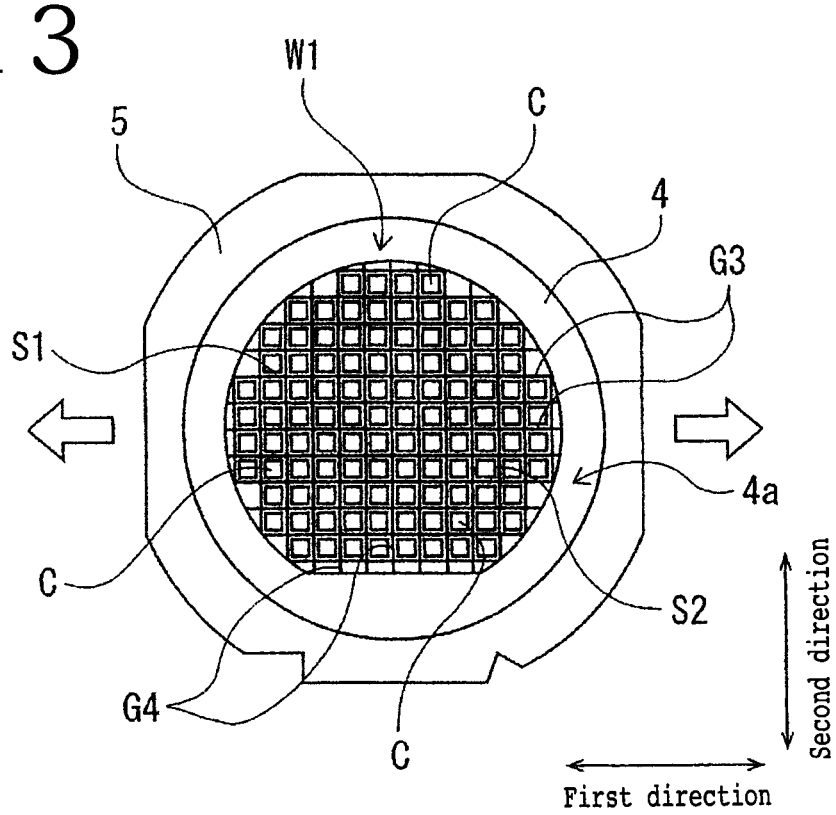
FIG. 13 is a plan view that depicts the workpiece in which second laser-processed grooves are formed and depicts a second expanding step of the second embodiment.

After the second laser processing step is carried out, similarly to the first expanding step, the width of the second laser-processed grooves G4 is enlarged by expanding the dicing tape 4 in the first direction orthogonal to the second direction as depicted in FIG. 13 while keeping the held state of the workpiece W1 by the workpiece holding means 40 and the frame holding means 41. The expansion operation is similarly to the above-described first expanding step. Specifically, the dicing tape 4 is pushed up by the expanding member 422 of the movement means 42 and the frame holding means 41 and the workpiece W1 are relatively separated. When the dicing tape 4 is expanded in a radial manner due to this, the width of the second laser-processed grooves G4 is enlarged and gaps are formed. Due to the forming of such gaps, even when debris generated in the second laser processing step enters the second laser-processed groove G4, it is possible to prevent the possibility of joining of the chips C obtained by the dividing due to the debris because the width of the second laser-processed grooves G4 is expanded by the second expanding step. In this manner, the workpiece W1 is completely divided to acquire the individual chips C. In order to keep the interval of the gaps between the respective chips C, the exposed part 4a in the region between the workpiece W1 and the frame 5 may be heated to be thermally shrunk by the heating means 49 similarly to the first expanding step.

As above, the laser processing apparatus 30 according to the present invention includes the workpiece holding means 40 that holds the workpiece W1 stuck to the annular frame 5 with the intermediary of the dicing tape 4, the laser beam irradiation means 45 that irradiates the workpiece W1 held by the workpiece holding means 40 with the laser beam LB2, and the imaging means 48 that images the workpiece W1, and further includes the frame holding means 41 that hold the annular frame 5, the movement means 42 for relatively separating the frame holding means 41 and the workpiece W1 and expanding the dicing tape 4, and the heating means 49 for applying heat to the region between the workpiece W1 on the dicing tape 4 and the frame 5 and shrinking the region. Thus, after the first laser-processed grooves G3 are formed in the workpiece W1, the first laser-processed grooves G3 can be enlarged by expanding the dicing tape 4 by the movement means 42 while keeping the held state of the workpiece W1 by the workpiece holding means 40 and the frame holding means 41. In addition, after the second laser-processed grooves G4 are formed in the workpiece W1, the second laser-processed grooves G4 can be enlarged by expanding the dicing tape 4 by the movement means 42 while keeping the held state of the workpiece W1 by the workpiece holding means 40 and the frame holding means 41. Therefore, even when debris generated in the laser processing enters the first laser-processed groove G3 or the second laser-processed groove G4, it is possible to prevent the possibility of joining of the chips C obtained by the dividing due to the debris and it becomes possible to completely divide the workpiece W1.

Regarding the laser processing apparatus 30, the case is described in which the frame holding means 41 and the workpiece W1 are relatively separated to expand the dicing tape 4 by raising the expanding member 422 by the movement means 42. However, the configuration is not limited thereto. For example, the frame holding means 41 and the workpiece W1 may be relatively separated to expand the dicing tape 4 by providing a raising/lowering mechanism on the side of the frame holding means 41 and lowering the side of the frame 5.

Furthermore, regarding the laser processing apparatus 30, the case of dividing the workpiece W1 in which a pattern is formed is described. However, the laser processing apparatus 30 can be applied also to the workpiece W in which a pattern is not formed like that depicted in the first embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of dividing a workpiece into predetermined dimensions based on a first direction and a second direction orthogonal to the first direction, the method comprising:
   a dicing tape sticking step of sticking a dicing tape to the workpiece;
   a first laser processing step of holding a side of the dicing tape on a holding table and irradiating the workpiece with a laser beam along the first direction to form first laser-processed grooves;
   a first expanding step of expanding the dicing tape in the second direction to enlarge width of the first laser-processed grooves after carrying out the first laser processing step;
   a second laser processing step of irradiating the workpiece with the laser beam along the second direction to form second laser-processed grooves while the first laser-processed grooves are enlarged in the second direction after carrying out the first expanding step; and
   a second expanding step of expanding the dicing tape in the first direction to enlarge width of the second laser-processed grooves after carrying out the second laser processing step.

2. Laser processing apparatus comprising:
   workpiece holding means for holding a workpiece supported by an annular frame with intermediary of a dicing tape;
   laser beam irradiation means for irradiating the workpiece held by the workpiece holding means with a laser beam;
   an image sensor that images the workpiece;
   frame holding means for holding the frame;
   means for moving the frame holding means and expanding the dicing tape in a first direction and in a second direction orthogonal to the first direction; and
   means for heating a region between the workpiece on the dicing tape and the frame and shrinking the region.

3. The method of claim 1, wherein the first laser-processed grooves fully cut the workpiece and expose the dicing tape.

4. The method of claim 3, wherein the second laser-processed grooves fully cut the workpiece and expose the dicing tape.

5. The laser processing apparatus of claim 2, the means for moving comprising a piston and a cylinder.

6. The laser processing apparatus of claim 2, the frame holding means comprising a frame placement base and a clamp part.

7. The laser processing apparatus of claim 2, wherein the means for moving are configured to expand the dicing tape in the second direction only in a first expanding step and in the first direction only in a second expanding step.

* * * * *